United States Patent
Yokoyama et al.

(10) Patent No.: US 7,852,898 B2
(45) Date of Patent: Dec. 14, 2010

(54) SEMICONDUCTOR LASER DEVICE AND METHOD FOR MANUFACTURING THE SAME

(75) Inventors: Takeshi Yokoyama, Hyogo (JP); Takayuki Kashima, Hyogo (JP); Kouji Makita, Hyogo (JP)

(73) Assignee: Panasonic Corporation, Osaka (JP)

( * ) Notice: Subject to any disclaimer, the term of this patent is extended or adjusted under 35 U.S.C. 154(b) by 151 days.

(21) Appl. No.: 12/235,320

(22) Filed: Sep. 22, 2008

(65) Prior Publication Data

US 2009/0086782 A1 Apr. 2, 2009

(30) Foreign Application Priority Data

Sep. 28, 2007 (JP) .............................. 2007-255470

(51) Int. Cl.
*H01S 5/00* (2006.01)
(52) U.S. Cl. .......................... 372/50.122; 372/50.121; 372/50.12; 372/50.1; 372/49.01
(58) Field of Classification Search .............. 372/49.01, 372/50.12, 50.121, 50.1, 50.122
See application file for complete search history.

(56) References Cited

U.S. PATENT DOCUMENTS

| 4,845,725 A | * | 7/1989 | Welch et al. | ............ | 372/46.016 |
| 6,067,310 A | * | 5/2000 | Hashimoto et al. | ....... | 372/49.01 |
| 6,734,111 B2 | | 5/2004 | Lindstrom et al. | | |
| 6,803,605 B2 | | 10/2004 | Lindstrom et al. | | |
| 2005/0153470 A1 | | 7/2005 | Lindstrom et al. | | |
| 2006/0239321 A1 | * | 10/2006 | Kume et al. | ............ | 372/50.121 |

FOREIGN PATENT DOCUMENTS

| JP | 3-89585 | 4/1991 |
| JP | 10-84161 | 3/1998 |
| JP | 10-223978 | 8/1998 |
| JP | 10-223979 | 8/1998 |
| JP | 2000-114654 | 4/2000 |
| JP | 2004-538652 | 12/2004 |

\* cited by examiner

*Primary Examiner*—Minsun Harvey
*Assistant Examiner*—Patrick Stafford
(74) *Attorney, Agent, or Firm*—Hamre, Schumann, Mueller & Larson, P.C.

(57) ABSTRACT

On a first region that is a part of one main face of a semiconductor substrate 1, a first semiconductor laser structure 10 is formed so as to have a first lower cladding layer 3, a first active layer 4 with a first quantum well structure and first upper cladding layers 5, 7, which are layered in this order from the semiconductor substrate side, thereby forming a first resonator. On a second region that is different from the first region, a second semiconductor laser structure 20 is formed so as to have a second lower cladding layer 13, a second active layer 14 with a second quantum well structure and a second upper cladding layer 15, 17, which are layered in this order, thereby forming a second resonator. End face coating films 31, 32 are formed on facets of the first and the second resonators, and a nitrogen-containing layer 30 is formed between the facets of the first and the second resonators and the facet coating film. In the semiconductor laser device provided with a high-output dual-wavelength lasers that are formed monolithically, the decrease of the COD level during the high-output operation of the laser can be suppressed.

9 Claims, 8 Drawing Sheets

SEMICONDUCTOR LASER DEVICE AND METHOD FOR MANUFACTURING THE SAME

BACKGROUND OF THE INVENTION

1. Field of the Invention

The present invention relates to a semiconductor laser device, and particularly relates to a monolithic type semiconductor device that has a plurality of emitting points, and a method for manufacturing the same.

2. Description of Related Art

As pick-up light sources for optical disk devices and light sources for optical information processing, optical communication and optical measurement, semiconductor laser devices are used. For example, as a pick-up light source for reproducing and recording with respect to a CD (compact disk) and a MD (mini disk), an infrared laser with a wavelength in the 780 nm band is used, and as a pick-up light source for reproducing and recording with respect to a DVD (digital video disk) with a higher density, an infrared laser with a wavelength in the 650 nm band is used.

In order to be compatible with a CD, a MD and a DVD, both an infrared laser and a red laser are necessary in one drive, so that a drive that is provided with optical integration units for both of the lasers generally is used. Whereas, in order to satisfy the requirements for downsizing and cost reduction of the drive, and optical adjustment and simplification of assembly processes and the like, further simplification of the optical integration unit itself has been sought recently. Thus, a dual-wavelength laser device having a configuration, in which the infrared laser with a wavelength in the 780 nm band and the red laser with a wavelength in the 650 nm band are integrated on the same substrate, has been utilized practically so as to contribute to the significant simplification of the optical integration unit.

Moreover, as a trend of an optical disk market, there are strong demands for the conformity to LS (light scribe) for describing a picture or a character on a label of a media by using an infrared laser for CDs and the conformity to the increase of the speeds of DVDs, so that both the increase of the output and the high reliability of the dual-wavelength lasers are required.

As one of the representative causes for inhibiting the high output driving in an utility level, melting destruction on a facet of a resonator, that is, COD (Catastrophic Optical Damage) deterioration is exemplified. This failure mode is generated because a vicinity of the facet of the resonator of the semiconductor laser serves as a region for absorbing light that is generated inside the laser. On a semiconductor surface of the facet of the resonator, a specific deep level that is generated according to absorption of oxygen and oxidation of the surface, and a deep level caused by a defect that is present on the semiconductor surface are generated, thereby substantially narrowing a band gap on the facet. According to heat caused by nonradiative recombination via this deep level, the band gap is decreased further, thereby generating a positive feedback that causes more optical absorption, so that a temperature of the facet is increased steeply, which results in the deterioration of the facet due to its melting.

In order to suppress the COD level, a method of diffusing impurity by solid state diffusion so as to disorder an active layer of the facet part and increase the band gap generally is used.

Further, methods for increasing the band gap by plasma treatment also are disclosed in JP3(1991)-89585A, JP10(1998)-84161A, JP10(1998)-223978A, JP10(1998)-223979A and JP2004-538652A as described below.

JP3(1991)-89585A suggests a technique for enhancing the COD level in an AlGaInP laser by substituting P of the cleaved facet with N and reforming a vicinity of the surface of the facet into GaInN and AlGaInN so as to increase the band gap. According to this manufacturing method, in order to substitute P with N, P firstly is desorbed at a high temperature ranging from 600° C. to 800° C., and at the same time, a $NH_3$ gas that is activated by ECR plasma is supplied to a surface of a sample so as to bond N with the desorbed site.

JP10(1998)-84161A discloses a technique for introducing an element from a facet of a compound semiconductor laser, by using plasma such as electron cyclotron resonance plasma (ECR plasma), which utilizes an interaction between a magnetic field and microwaves. Thereby, the band gap of the semiconductor layer in the vicinity of the facet can be widened more than a band of the semiconductor layer in another region, and also can function as a window region. Moreover, since the semiconductor layer formed by the above-described technique is an excellent high-resistance layer having a low surface level density, a leak current toward the facet can be suppressed, and an effect of suppressing the COD damage can be reduced due to a decrease of a center of the nonradiative recombination on an interface.

JP10(1998)-223978A and JP10(1998)-223979A disclose nitriding the semiconductor layer of the facet of the resonator by irradiation of $N_2$ plasma. It is described that a gap in the vicinity of the facet is widened thereby, and in the case where the active layer includes a quantum well, the active layer of the facet of the resonator can be disordered so as to widen the gap. Further, it also is described that a resistance of the nitrided region is increased, and thus can suppress an effect of a reactive current of the facet region, thereby realizing the high-output and long-life semiconductor laser.

JP2004-538652A discloses a manufacturing method for forming a nitride layer on an any structure of a GaAs semiconductor laser that is constituted of a material system selected from the group consisting of GaAs, GaAlAs, InGaAsP and InGaAs. Similarly to the above-described patent document, this method aims to remove a contamination on the surface and decrease an interfacial recombination velocity by treating with the plasma including nitrogen.

The above-described disordering by the plasma treatment is effective for increasing a band gap on an output facet. However, the prior arts as described in the above patent documents have a problem of decreasing the COD level during aging in high-output dual wavelength lasers including an AlGaAs infrared laser and an AlGaInP red laser that are formed monolithically on the same substrate.

Firstly, none of JP3(1991)-89585A, JP10(1998)-84161A, JP10(1998)-223978A, JP10(1998)-223979A and JP2004-538652A refers to the disordering technique by window formation by the impurity diffusion. All of them disclose forming the nitride-based semiconductor layer in the output facet region so as to widen the gap by utilizing the plasma including nitrogen elements, thereby allowing it to function as a window structure. In the case of forming a nitride semiconductor such as AlGaN, GaN, AlGaInN and GaInN in the output facet region by applying any of the techniques described in those documents to the above-described high-output dual wavelength lasers (the AlGaAs infrared laser/the AlGaInP red laser), it is possible to increase the initial COD level by the expansion of the band gap on the facet.

However, in the case of forming the nitride semiconductor layer that functions also as the window structure, a lattice mismatch between a semiconductor layer and a nitride semiconductor layer of a gain region becomes large, which causes a large distortion of the facet. It is considered that, if continuing aging in this state, a defect caused by the distortion is generated in a region having a high density of light energy, and the COD level is decreased gradually during the aging as the defect is eroded.

Moreover, plasma doping with high energy is necessary for disordering the active layer by the plasma treatment. Thus, by channeling the impurity, the impurity enters also into the active layer that contributes to the emission, which may results in a decrease of the reliability.

Moreover, since the crystallinity of the facet part is decreased after doping the impurity, heat treatment at a high temperature is necessary, but it is difficult to anneal at the high temperature after forming the reflective film on the facet.

Further, recently, it has been understood that a solid state diffusion region affects a beam divergence angle in the facet window structure that is formed by the solid state diffusion. That is, since the beam divergence angle with a low aspect can be obtained by controlling a width of the solid state diffusion region, unless optical confinement of a laser gain part is strengthen, it has become possible to secure the reliability even at high output.

On the other hand, for forming the facet window structure using the plasma doping, the strengthening of the optical confinement of the laser gain part and recovery annealing at a narrow temperature margin after forming the facet reflective film are necessary, so that it is difficult to obtain sufficient reliability at high output.

Further, also in the facet window structure by the solid state diffusion, a new problem occurs according to the recent increase of the output. That is, in a window formation step for disordering the active layer by diffusing the impurity, it becomes possible to increase the initial COD level by a band gap increasing effect due to the disordering of the active layer and an increase of a resistance of the facet. However, a phenomenon of decreasing the COD level occurs during the aging.

It is considered that this is resulted from a point defect due to cutting of a bond by the diffusion of the impurity, generation of a hole and the like, which occur according to the heating generated due to application of power. Thus, even if the initial COD level can be increased by the window formation or the like, the decrease of the COD level during the aging is accelerated, so that the COD level is degraded largely after applying power. Such a degradation inhibits the increase of the output significantly.

SUMMARY OF THE INVENTION

The present invention aims to provide a semiconductor laser device that is provided with high-output dual lasers formed monolithically and can suppress a decrease of a COD level during a high output operation of a laser, and a method for manufacturing the same.

In order to solve the above problem, the semiconductor laser device of the present invention includes: a semiconductor substrate; a first semiconductor laser structure that has a first lower cladding layer, a first active layer with a first quantum well structure and a first upper cladding layer, which are formed on a first region that is a part of one main face of the semiconductor substrate and are layered in this order from the semiconductor substrate side, thereby forming a first resonator; a second semiconductor laser structure that has a second lower cladding layer, a second active layer with a second quantum well structure and a second upper cladding layer, which are formed on a second region that is different from the first region on the one main face of the semiconductor substrate and are layered in this order from the semiconductor substrate side, thereby forming a second resonator; a facet coating film that is formed on facets of the first resonator and the second resonator; and a nitrogen-containing layer that is formed between the facets of the first resonator and the second resonator and the facet coating film.

According to this configuration of the semiconductor laser device, since the nitrogen containing layer is formed between the facet and the facet coating film of the resonator, the impurity diffusion is suppressed. Thereby it is possible to suppress speeds of defect increment and defect elongation resulting from the impurity diffusion, so that the decrease of the COD level during the high-output operation of the laser can be suppressed.

The method for manufacturing a semiconductor laser device of the present invention includes: a first step of laminating a first lower cladding layer of a first conductive type, a first active layer with a first quantum well structure and a first upper cladding layer of a second conductive type in this order on one main face of the semiconductor substrate, thereby forming a first semiconductor laser structure; a second step of removing a part of the first semiconductor laser structure on one main face of the semiconductor substrate by etching; a third step of laminating a second lower cladding layer of a first conductive type, a second active layer with a second quantum well structure and a second upper cladding layer with a second conductive type in this order in a region on the semiconductor substrate where the first semiconductor laser structure is removed, thereby forming the second semiconductor laser structure; a fourth step of removing a part of the second semiconductor laser structure formed on the first semiconductor laser structure; a fifth step of etching the first upper cladding layer and the second upper cladding layer so as to form a first stripe structure and a second stripe structure, respectively; a sixth step of cleaving the structures formed by the above-described steps so as to form facets of a first resonator and a second resonator by the first semiconductor laser structure and the second semiconductor laser structure, respectively; a seventh step of introducing nitrogen to the facets of the first resonator and the second resonator so as to form a nitrogen-containing layer; and an eighth step of forming facet coating films onto the facets of the first resonator and the second resonator after the seventh step of forming the nitrogen-containing layer.

According to this method for manufacturing the semiconductor laser device, since the surface layer on an interface between the facet of the resonator and the facet coating film is subjected to the nitrogen treatment in the seventh step, it is possible to suppress the defect increment and the defect elongation caused by the subsequent steps.

These and other advantages of the present invention will become apparent to those skilled in the art upon reading and understanding the following detailed description with reference to the accompanying figures.

DETAILED DESCRIPTION OF THE INVENTION

Figure 1:
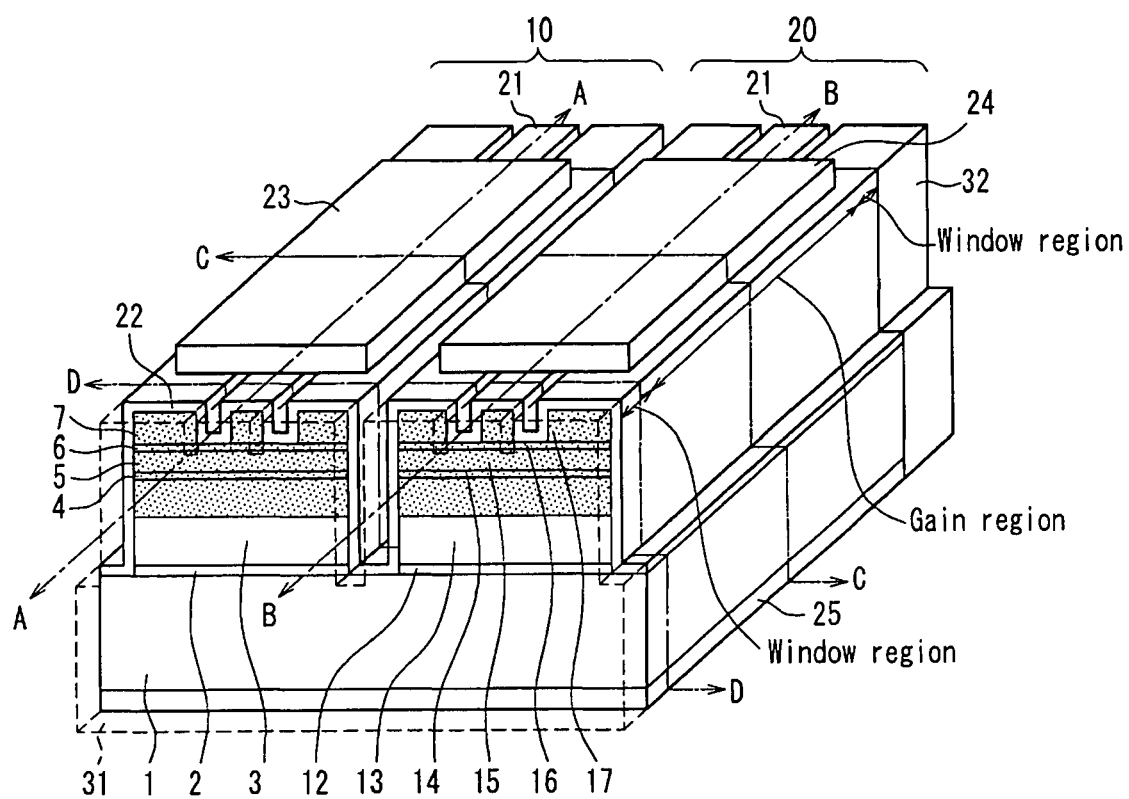
FIG. 1 is a perspective view of a semiconductor laser device of an embodiment of the present invention, which includes dual-wavelength lasers that are formed monolithically.

The present invention can have various embodiments as described below, on the basis of the above-described configuration.

In the semiconductor laser device of the present invention, it is preferable that a facet window structure in which the first quantum well structure or the second quantum well structure is disordered is formed on at least one of the facets of the first resonator and the second resonator.

Moreover, it is possible to adopt a configuration in which the disordering is formed with impurity of Zn or Si.

Moreover, it is possible to adopt a configuration in which a constituent material of the first active layer is $Al_xGa_{1-x}As$ ($0 \leq x \leq 1$), and a constituent material of the second active layer is $(Al_xGa_{1-x})_yIn_{1-y}P$ ($0 \leq x \leq 1$, $0 \leq y \leq 1$).

Moreover, it is possible to adopt a configuration in which the first upper cladding layer and the second upper cladding layer are made of $Al_xGa_{1-x}As$ ($0 \leq x \leq 1$) or $(Al_xGa_{1-x})_yIn_{1-y}P$ ($0 \leq x \leq 1$, $0 \leq y \leq 1$).

It is preferable to adopt a configuration in which a layer thickness of the nitrogen-containing layer is 0.1 μm or less.

Moreover, it is preferable to adopt a configuration in which a concentration of nitrogen in the nitrogen-containing layer is $1 \times 10^{19}$ cm$^{-3}$ or less.

Moreover, it is preferable to adopt a configuration in which the facet coating film is formed commonly in the first semiconductor laser structure and the second semiconductor laser structure, and a reflectance of the facet coating film on an output facet ranges between 3% and 6% inclusive with respect to an oscillation wavelength of the first semiconductor laser structure, and ranges between 5% and 9% inclusive with respect to an oscillation wavelength of the second semiconductor laser structure.

Moreover, it is preferable to adopt a configuration in which a film of the facet coating film nearest to the nitrogen-containing layer is an $Al_2O_3$ film.

Moreover, it is preferable to adopt a configuration in which a pile-up amount of Fe, Cr, Ni and Cu near a boundary between the facet coating film and the facet window structure is $3 \times 10^{17}$ atoms/cm$^3$ or less.

In the method for manufacturing a semiconductor laser device of the present invention, it is preferable to include a ninth step of introducing impurity into a partial region of each of the first active layer and the second active layer so as to disorder the partial region, the ninth step being performed between the fourth step and the fifth step, wherein in the sixth step the first semiconductor laser structure and the second semiconductor laser structure are cleaved at a position in the disordered partial region of each of the first active layer and the second active layer so as to form the facets of the first resonator and the second resonator.

Moreover, the disordering of the active layer by the impurity in the ninth step can be performed by forming a layer containing the impurity in the partial region on the first upper cladding layer and the second upper cladding layer, and diffusing the impurity toward the first upper cladding layer and the second upper cladding layer.

Moreover, the step of introducing the nitrogen in the seventh step can be performed by plasma irradiation using a gas containing nitrogen elements.

Moreover, the plasma irradiation can be performed with electron cyclotron resonance plasma. In this case, the irradiation of the electron cyclotron resonance plasma is performed in a chamber provided with an Al target.

The semiconductor laser device according to the embodiment of the present invention and the method for manufacturing the same will be described below in detail.

Figure 2A:
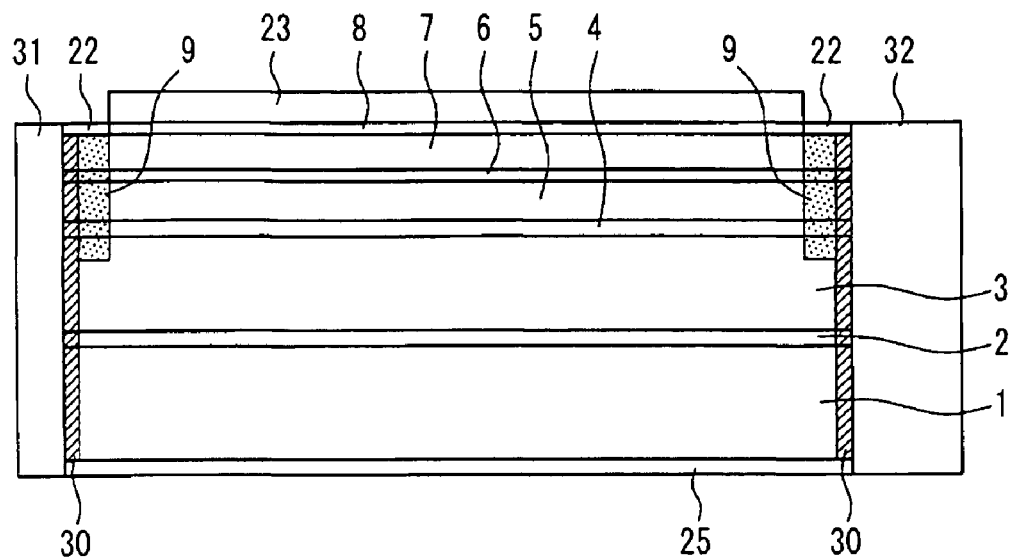
FIG. 2A is a cross-sectional view of the semiconductor laser device, which is cut along a line A-A.
Figure 2B:
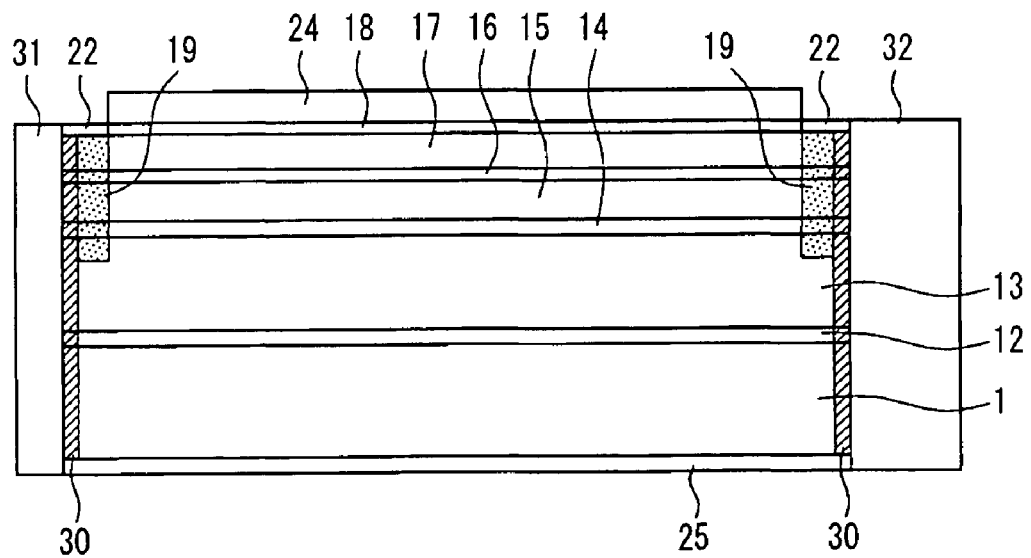
FIG. 2B is a cross-sectional view of the semiconductor laser device, which is cut along a line B-B.

FIG. 1 shows a perspective view of the semiconductor laser of this embodiment. FIGS. 2A and 2B respectively show cross-sectional views, which are cut along lines A-A and B-B of FIG. 1. Firstly, a configuration of the semiconductor laser device will be explained. This semiconductor laser device has a configuration where an infrared laser 10 with an oscillation wavelength of around 780 nm and a red laser 20 with an oscillation wavelength of around 650 nm are formed monolithically on a common n-type GaAs substrate 1. In both of the infrared laser 10 and the red laser 20, window structures 9 and 19 are formed by impurity diffusion.

The infrared laser 10 is provided with a n-type GaAs infrared buffer layer 2, a n-type AlGaInP infrared lower cladding layer 3, a GaAs/AlGaAs infrared active layer 4 (oscillation wavelength: 780 nm), a p-type AlGaInP infrared first upper cladding layer 5, a p-type GaInP infrared etching stopping layer 6, a p-type AlGaInP infrared second upper cladding layer 7 and a p-type AlGaAs infrared contact layer 8, which are layered in this order.

The red laser 20 is provided with a n-type GaAs red buffer layer 12, a n-type AlGaInP red lower cladding layer 13, a GaInP/AlGaInP red active layer 14 (oscillation wavelength: 650 nm), a p-type AlGaInP red first upper cladding layer 15, a p-type GaInP red etching stopping layer 16, a p-type AlGaInP red second upper cladding layer 17 and a p-type AlGaAs red contact layer 18, which are layered in this order.

The infrared second upper cladding layer 7 and the red second upper cladding layer 17 are divided by a groove that is formed from a surface thereof to the infrared etching stopping layer 6 and the red etching stopping layer 16 so as to form a ridge 21.

In window regions where the window structures 9, 19 are formed, the p-type infrared contact layer 8 and the p-type red contact layer 18 are removed. A current block layer 22 is formed over upper surfaces of the p-type infrared contact layer 8 and the p-type red contact layer 18, and upper surfaces of the infrared second upper cladding layer 7 and the red second upper cladding layer 17 that are exposed due to the removal of the p-type infrared contact layer 8 and the p-type red contact layer 18.

An opening (not illustrated) is formed in the current block layer 22 on an upper surface of the ridge 21, and a p-side infrared electrode 23 and a p-side red electrode 24 that are formed on the current block layer 22 are connected to the p-type infrared contact layer 8 and the p-type red contact layer 18 via the opening. On a rear surface of the n-type GaAs substrate 1, a n-side electrode 25 is formed.

On a surface of a facet of an optical resonator having the window structures 9, 19 that are obtained by cleaving the substrate 1 on which the dual-wavelength semiconductor lasers are formed as described above, at an interval of a predetermined optical resonator length, a nitrogen-containing layer 30 (see FIGS. 2A and 2B) containing nitrogen is formed. Incidentally, the nitrogen-containing layer 30 is not illustrated in FIG. 1 for simplicity of the illustration. Further, on a facet of the resonator on a side where laser light is outputted, a low-reflectance coating film 31 is provided, and a high-reflectance coating film 32 is provided on a facet of the resonator on a side opposite to the output facet. The low-reflectance coating film 31 is illustrated in broken lines in FIG. 1 for visibility of the figure.

The effects of providing the nitrogen-containing layer 30 on the surfaces of the facet of the optical resonator having the window structures 9, 19 of the infrared laser 10 and the red laser 20 will be described later.

Next, a method for manufacturing the semiconductor laser with the above-described configuration will be explained with reference to FIGS. 3 to 6, 7A to 7C, 8A to 8C, 9A to 9C and 10A to 10C.

Figure 3:
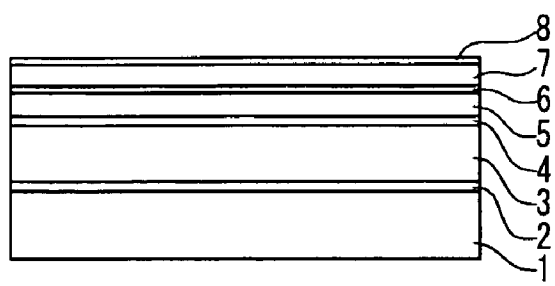
FIGS. 3 to 6, 7A, 8A, 9A, 10A, 7B, 8B, 9B and 10B are cross-sectional views showing steps in a method for manufacturing the semiconductor laser device.
Figure 4:
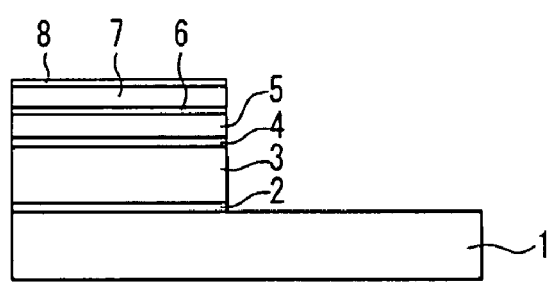

FIGS. 3 to 6 show steps for forming an infrared/red element structure. Firstly, an infrared laser element structure that is provided with: an infrared buffer layer 2 made of n-type GaAs; a n-type infrared lower cladding layer 3 made of $(Al_xGa_{1-x})_yIn_{1-y}P$ ($0 \leq x \leq 1$, $0 \leq y \leq 1$); an infrared active layer 4 made of a multiple quantum well containing $Al_xGa_{1-x}As$ ($0 \leq x \leq 1$) layer; a p-type infrared first upper cladding layer 5 made of $(Al_xGa_{1-x})_yIn_{1-y}P$ ($0 \leq x \leq 1$, $0 \leq y \leq 1$); a p-type infrared etching stopping layer 6; a p-type infrared second upper cladding layer 7; and a p-type infrared contact layer 8 is formed on the n-type substrate 1 as shown in FIG. 3, by a crystal growth technique using a metal organic chemical vapor deposition (MOCVD) method. Next, as shown in FIG. 4, a region for forming the red laser is removed in a stripe by etching.

Figure 5:
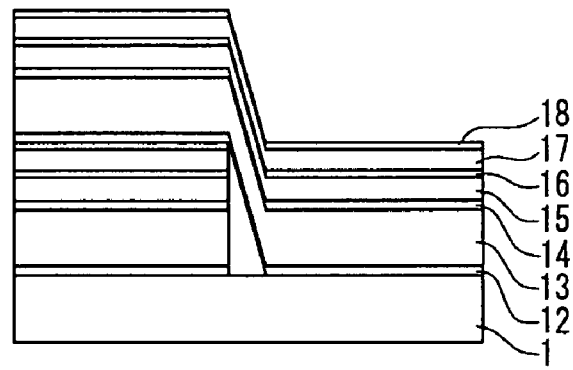

Next, as shown in FIG. 5, a red laser element structure including: a red buffer layer 12 made of n-type GaAs; a n-type red lower cladding layer 13; a red active layer 14 made of a multiple quantum well containing $(Al_xGa_{1-x})_yIn_{1-y}P$ ($0 \leq x \leq 1$, $0 \leq y \leq 1$); a p-type red first upper cladding layer 15; a p-type red etching stopping layer 16; a p-type red second upper cladding layer 17; and p-type red contact layer 18 is formed in the region where the infrared laser element structure is removed by a MOCVD method.

In an example based on this embodiment, both of the p-type infrared contact layer 8 and the p-type red contact layer 18 are made of GaAs whose value of x is 0 and thickness is 0.2 μm.

Moreover, the p-type second upper cladding layers 7, 17 of the infrared laser and the red laser are made of $(Al_xGa_{1-x})_yIn_{1-y}P$ ($0 \leq x \leq 1$, $0 \leq y \leq 1$) layers, and in one example, both of them have a value x of 0.7, a value y of 0.3 and a film thickness of 1.6 μm.

Moreover, the infrared etching stopping layer 6 is made of $Al_xGa_{1-x}As$ ($0 \leq x \leq 1$), and the red etching stopping layer 16 is made of $(Al_xGa_{1-x})_yIn_{1-y}P$ ($0 \leq x \leq 1$, $0 \leq x \leq 1$). And in one example, the infrared etching stopping layer 6 is made of $Al_{0.4}Ga_{0.6}As$, and the red etching stopping layer 16 is made of $Ga_{0.5}In_{0.5}P$.

Figure 6:
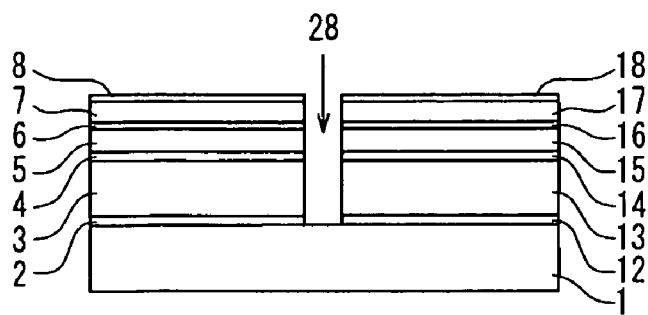

Next, as shown in FIG. 6, the red laser element structure that is formed on the infrared laser element structure is removed, and etching is performed so as to form an element separating groove 28 for separating the infrared/red laser element structure electrically and a groove for cleavage (not illustrated).

FIGS. 7A to 7C, 8A to 8C, 9A to 9C and 10A to 10C show subsequent steps for processing the infrared/red laser element structure that is formed as described above. FIGS. 7A, 8A, 9A and 10A show cross sections of a gain region, which are taken along the alternate long and short dash line C-C that is shown in FIG. 1. FIGS. 7B, 8B, 9B and 10B show cross sections of a window region, which are taken along the alternate long and short dash line D-D that is shown in FIG. 1. FIGS. 7C, 8C, 9C and 10C show plan views. Incidentally, these plan views show only an unit region extracted from a plurality of the infrared/red laser element structures that are formed by the above-described steps.

Figure 7A:
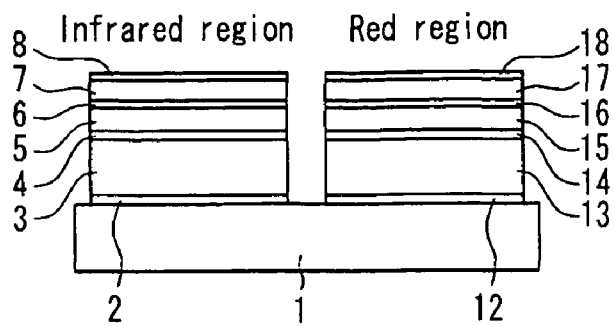
Figure 7B:
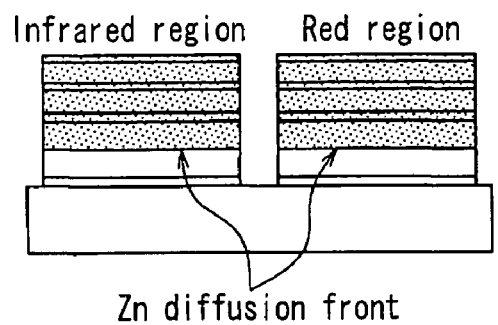
Figure 7C:
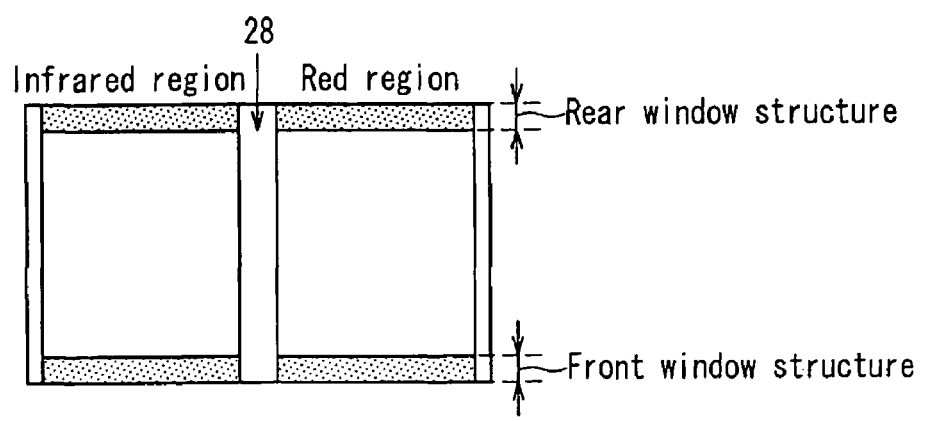
FIGS. 7C, 8C, 9C and 10C are plan views showing steps in the method for manufacturing the semiconductor laser device.

Firstly, a facet window structure is formed with respect to the element structure that is formed as shown in FIG. 6. On an upper surface of a region that becomes a laser facet part, a pattern of a Zn diffusion source is formed by sputtering so as to pile up a cap film, which are not illustrated though. Thereafter, the Zn is diffused by heat treatment, and compositions of active layers of the infrared laser and the red laser are averaged, thereby forming a window structure region illustrated with dots) as shown in FIGS. 7B and 7C.

Figure 8A:
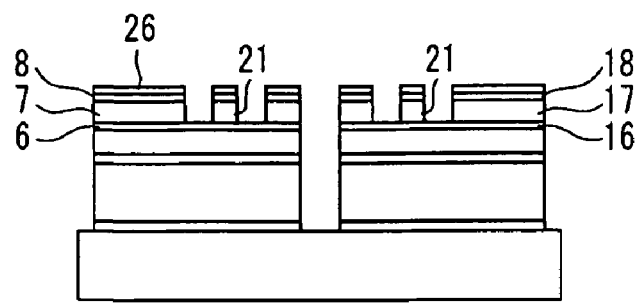
Figure 8B:
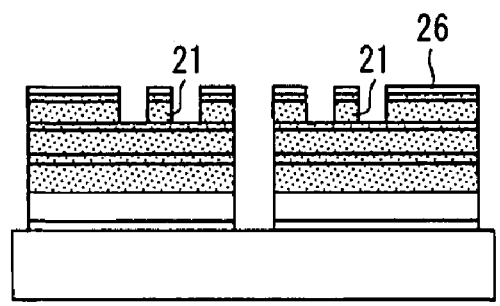
Figure 8C:
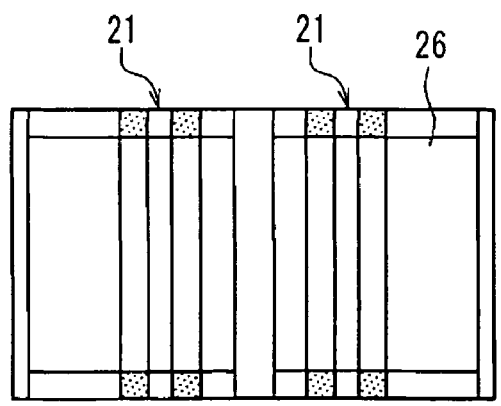

Next, in order to form ridges for the infrared laser and the red laser, a $SiO_2$ layer is applied and a stripe pattern is formed by using photolithography and dry etching techniques, thereby forming a stripe-shaped $SiO_2$ film 26 as shown in FIGS. 8A to 8C. Further, by using the stripe-shaped $SiO_2$ film 26 as a mask, the infrared second upper cladding layer 7 and the red second upper cladding layer 17 are etched to reach the infrared etching stopping layer 6 and the red etching stopping layer 16, thereby forming the ridges 21.

The etching also may be performed by dry etching and wet etching in combination, by using inductively coupled plasma or reactive ion plasma. Herein, the infrared second upper cladding layer 7, the red second upper cladding layer 17, the p-type infrared contact layer 8 and the p-type red contact layer 18 are set to have the above-described film thicknesses and compositions, so that the ridges 21 can be formed at the same time under the same conditions of the dry etching and the wet etching.

Figure 9A:
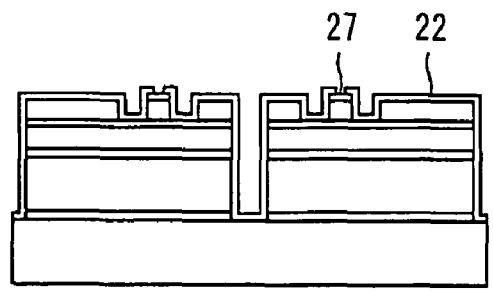
Figure 9B:
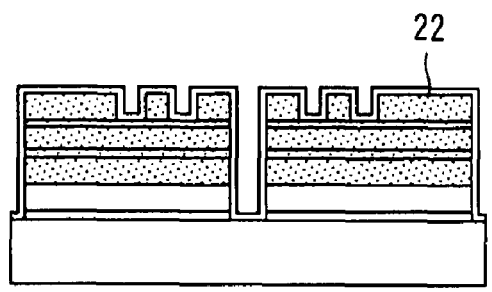
Figure 9C:
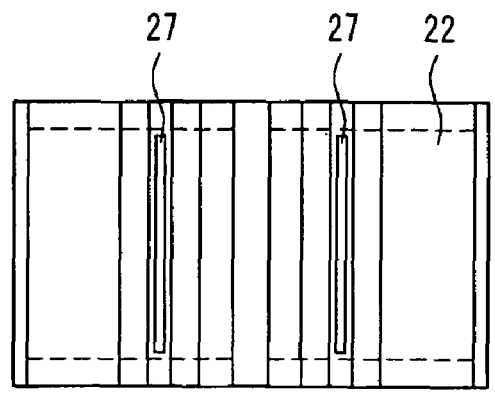
Figure 10A:
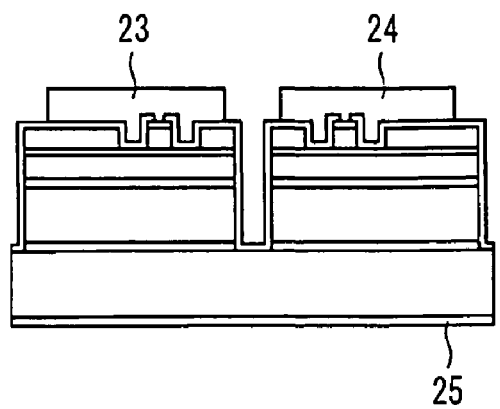
Figure 10B:
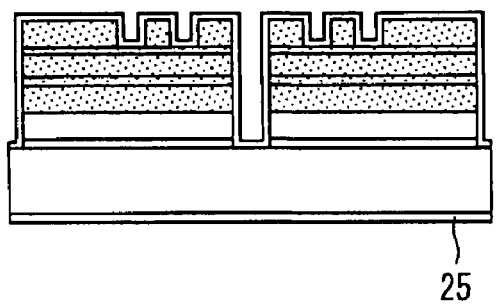
Figure 10C:
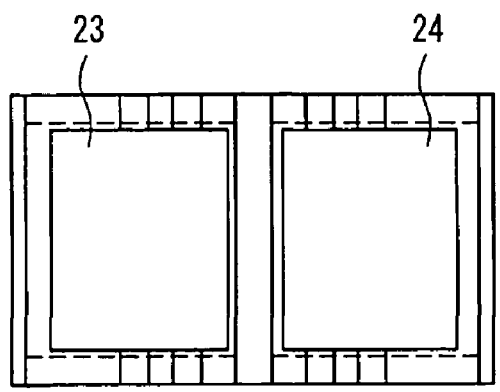

Next, by using the photolithography technique, an etching pattern is formed in order to etch the p-type infrared contact layer 8 and the p-type red contact layer 18 in the region above the ridge 21 in which the Zn is diffused, and etching is performed by using a hydrogen fluoride-based etchant (not illustrated). Next, all of the $SiO_2$ film 26 is removed, and as shown in FIGS. 9A and 9C, a dielectric film as the current block layer 22, for example, a SiN film is formed. Next, an opening 27 is formed in the current block layer 22 in a top part of the ridge 21 of the gain region for forming a contact. Next, as shown in FIGS. 10A to 10C, a p-side infrared electrode 23 and a p-side red electrode 24 are formed by gold plating, and a n-side electrode 25 is formed.

Next, a semiconductor laser wafer in which the monolithic dual-wavelength lasers are formed in the above-described steps is made into a bar state at an interval of the predetermined resonator length by cleaving it, thereby forming the facet of the optical resonator. Thereafter, the facet of the optical resonator is irradiated with plasma by using a mixed gas of an Ar gas and a $N_2$ gas, thereby forming the nitrogen-containing layer 30 (see FIGS. 2A and 2B). In the present embodiment, the plasma irradiation can be performed by using electron cyclotron resonance sputtering apparatus (ECR sputtering apparatus).

Further, in the ECR sputtering apparatus, the low-reflectance coating film 31 is formed on the output facet by two-layered coating of $Al_2O_3/SiO_2$, so that reflectances of the red laser 20 and the infrared laser 10 range from 5% to 9% and from 3% to 6%, respectively. The rear-side facet is coated with a multilayer film of $Al_2O_3/SiO_2$/amorphous Si/$SiO_2$/amorphous Si so as to form the high-reflectance coating film 32, so that both of the reflectances of the red laser 20 and the infrared laser 10 are 90% or more. More preferably, the reflectances of the red laser 20 and the infrared laser 10 on the output facet are 7% and 5%, respectively.

According to the above-described structure, it is possible to suppress the COD level decrease after the aging while keeping the initial COD level.

Incidentally, in the present embodiment, Zn is diffused as the impurity for forming the window structure, but Si also can be used as the impurity.

Moreover, the plasma irradiation by using the mixed gas of the Ar gas and the $N_2$ gas that is performed in the present embodiment requires appropriate treatment, because, if the excessive nitrogen treatment is performed, crystallinity deteriorates, which can cause a COD level decrease. If treating only with Ar, sputter damage is generated in the semiconductor layer due to the sputtering effect, so that the plasma atmosphere preferably contains the $N_2$ gas at a concentration of 10% or more.

If the nitrogen used in the $N_2$ plasma irradiation enters into the semiconductor layer too deeply, the semiconductor surface is damaged, and thus it preferably is doped so as to be contained within a depth of 0.1 μm from the surface. If excessive nitrogen is doped, the decrease of the COD level is caused by the point defect, so that the nitrogen preferably is doped to no more than a depth of $10^{19}$ cm$^{-3}$.

Incidentally, the treatment is not limited to the ECR plasma, and any plasma can be used as long as it enables the plasma irradiation with respect to the facet with low damage. For example, helicon wave plasma also may be used.

Moreover, after the plasma irradiation with respect to the facet of the optical resonator, it is preferable to perform coating continuously in a vacuum.

Further, there preferably is no pollution by heavy metals or the like near the boundary between the reflective coating film and the semiconductor layer of the facet of the resonator, because due to heavy-metals pollution, a deep level is formed on the facet of the resonator, which may decrease the COD level and harm the reliability. Specifically, pile-up amounts of Fe, Cr, Ni and Cu preferably are $3\times10^{17}$ atoms/cm$^3$ or less.

In order to suppress the effect of the impurity pollution at maximum limit, the plasma treatment by using the ECR sputtering apparatus preferably is performed in a chamber that is provided with an Al target.

Results of COD level measurements of the semiconductor laser device of the present embodiment that is manufactured as described above and a semiconductor laser device that is not treated by the plasma for comparison, at their initial states and after the aging, will be described below.

Conditions for aging in the red laser include a temperature of 25° C., an output CW of 145 mW, an aging time of 140 hours and APC (Auto power control) driving. Moreover, conditions for aging in the infrared laser include a temperature of 25° C., an output of 160 mW, an aging time of 140 hours and APC driving. Both of the COD level are measured at room temperature by continuous wave (CW) measurement. The aging is performed under the condition for high acceleration of deterioration with respect to each of the semiconductor laser devices in order to reduce a time required for the evaluations.

Figure 11A:
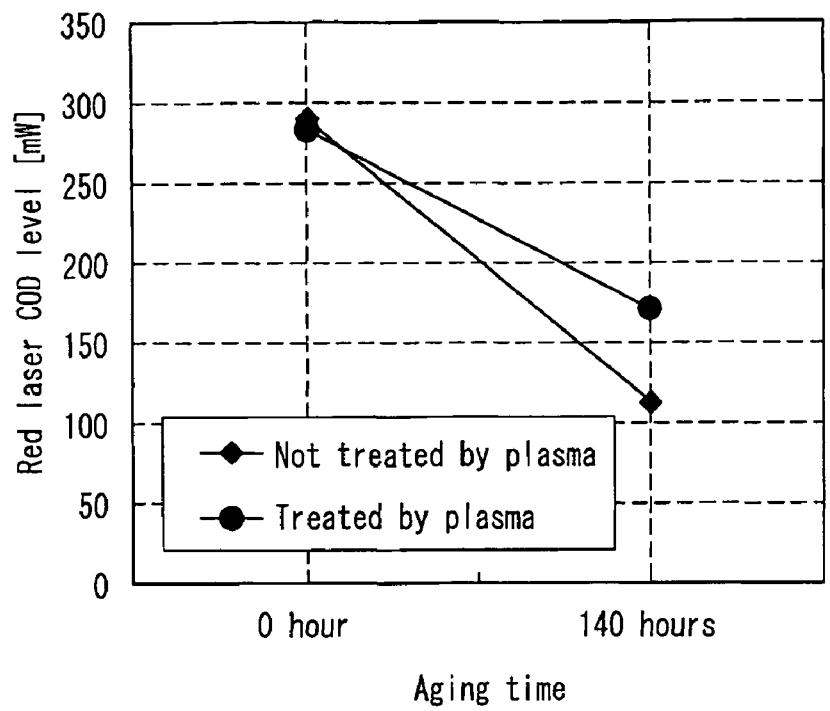
FIGS. 11A and 11B are views showing results of COD evaluations of the semiconductor laser device according to the embodiment of the present invention before and after aging.
Figure 11B:
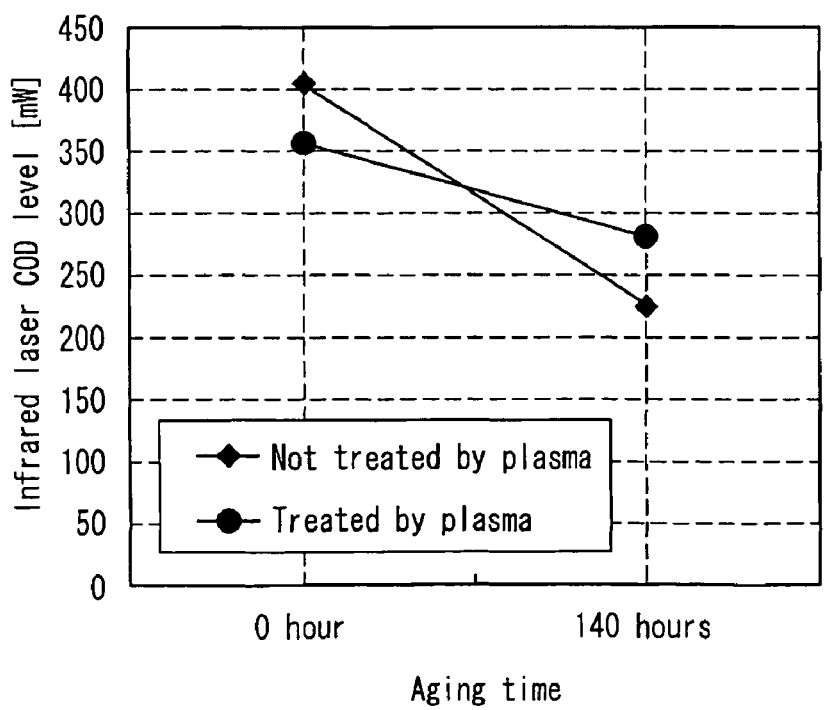

The results of the measurements of the COD levels are shown in FIGS. 11A and 11B. FIG. 11A shows the result obtained by using the red laser, and FIG. 11B shows the result obtained by using the infrared laser. Horizontal axes represent aging times (hours), and vertical axes represent COD levels. Moreover, black circle marks represent the results of the semiconductor laser device that is subjected to the plasma treatment according to this embodiment, and black diamond-shaped marks represent the results of the semiconductor laser device that is not subjected to the plasma treatment.

Regarding the red laser, the initial COD levels are equivalent in either of the conditions. Whereas, the COD level of the semiconductor laser device that is not subjected to the plasma treatment is decreased significantly after the aging, on the other hand, the decrease of the COD level of the semiconductor laser device of the present embodiment after the aging is suppressed.

Moreover, in the infrared laser, the COD level in the initial state in the present embodiment is low, but a COD level decreasing amount after the aging is suppressed.

The reason for suppressing the degradation of the COD level after the aging, in the case where the facet part is subjected to the nitrogen treatment in the present embodiment as described above, can be considered as follows. In the impurity diffusion region of the facet window part, where heat generation is caused due to the aging, the surface layers of the semiconductor interface and the reflective film interface, where the heat generation mostly occurs, are treated with the nitrogen, so that the diffusion of the impurity forming the window structure can be suppressed, thereby decreasing the speed of the defect increment or the defect elongation during the aging.

Incidentally, the reason for the decrease of the initial COD level in the case of using the AlGaAs-based material that constitutes the infrared laser is considered to be because, if containing the nitrogen in low concentration, a huge band gap bowing effect occurs, and the band gap is decreased.

However, in the present invention, the band gap decreasing effect due to the huge band gap bowing is compensated by the window structure resulting from the impurity diffusion by forming the facet window, whereby the high-utility COD level is obtained. Therefore, the semiconductor laser device that can achieve both of the high-output operation and the high-reliability operation can be obtained.

Incidentally, in the present embodiment, the semiconductor lasers made of the AlGaInP-based material and the AlGaAs-based material have been explained, but the present invention can be applied also to semiconductor laser devices made of materials other than the above-described materials.

Further, in the present embodiment, the window formation by the heat diffusion of Zn as the impurity has been explained, but the present invention can be applied also to semiconductor deices that adopt window formation by impurities containing Si or ion implantation.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor laser device comprising:
   a semiconductor substrate;
   a first semiconductor laser structure that has a first lower cladding layer, a first active layer with a first quantum well structure and a first upper cladding layer, which are formed on a first region that is a part of one main face of the semiconductor substrate and are layered in this order from the semiconductor substrate side, thereby forming a first resonator;
   a second semiconductor laser structure that has a second lower cladding layer, a second active layer with a second quantum well structure and a second upper cladding layer, which are formed on a second region that is different from the first region on the one main face of the semiconductor substrate and are layered in this order from the semiconductor substrate side, thereby forming a second resonator;

a facet coating film that is formed on facets of the first resonator and the second resonator; and a nitrogen-containing layer that is formed between the facets of the first resonator and the second resonator and the facet coating film, wherein a layer thickness of the nitrogen-containing layer is 0.1 μm or less.

2. The semiconductor laser device according to claim 1, wherein a facet window structure in which the first quantum well structure or the second quantum well structure is disordered is formed on at least one of the facets of the first resonator and the second resonator.

3. The semiconductor laser device according to claim 2, wherein the disordering is formed with impurity of Zn or Si.

4. The semiconductor laser device according to claim 1, wherein a constituent material of the first active layer is $Al_xGa_{1-x}As$ ($0 \leq x \leq 1$), and a constituent material of the second active layer is $(Al_xGa_{1-x})_yIn_{1-y}P$ ($0 \leq x \leq 1$, $0 \leq y \leq 1$).

5. The semiconductor laser device according to claim 4, wherein the first upper cladding layer and the second upper cladding layer are made of $Al_xGa_{1-x}As$ ($0 \leq x \leq 1$) or $(Al_xGa_{1-x})_yIn_{1-y}P$ ($0 \leq x \leq 1$, $0 \leq y \leq 1$).

6. A semiconductor laser device comprising:

a semiconductor substrate;

a first semiconductor laser structure that has a first lower cladding layer, a first active layer with a first quantum well structure and a first upper cladding layer, which are formed on a first region that is a part of one main face of the semiconductor substrate and are layered in this order from the semiconductor substrate side, thereby forming a first resonator;

a second semiconductor laser structure that has a second lower cladding layer, a second active layer with a second quantum well structure and a second upper cladding layer, which are formed on a second region that is different from the first region on the one main face of the semiconductor substrate and are layered in this order from the semiconductor substrate side, thereby forming a second resonator;

a facet coating film that is formed on facets of the first resonator and the second resonator; and a nitrogen-containing layer that is formed between the facets of the first resonator and the second resonator and the facet coating film, wherein a concentration of nitrogen in the nitrogen-containing layer is $1 \times 10^{19}$ cm$^{-3}$ or less.

7. The semiconductor laser device according to claim 1, wherein the facet coating film is formed commonly in the first semiconductor laser structure and the second semiconductor structure, and a reflectance of the facet coating film on an output facet ranges between 3% and 6% inclusive with respect to an oscillation wavelength of the first semiconductor laser structure, and ranges between 5% and 9% inclusive with respect to an oscillation wavelength of the second semiconductor laser structure.

8. The semiconductor laser device according to claim 1, wherein a film of the facet coating film nearest to the nitrogen-containing layer is an $Al_2O_3$ film.

9. The semiconductor laser device according to claim 1, wherein a pile-up amount of Fe, Cr, Ni and Cu near a boundary between the facet coating film and the facet window structure is $3 \times 10^{17}$ atoms/cm$^3$ or less.

* * * * *